(12) United States Patent
Kwan et al.

(10) Patent No.: US 9,316,930 B2
(45) Date of Patent: Apr. 19, 2016

(54) LOW-CONTAMINATION OPTICAL ARRANGEMENT

(75) Inventors: Yim-Bun Patrick Kwan, Aalen (DE); Stefan Xalter, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1107 days.

(21) Appl. No.: 13/023,840

(22) Filed: Feb. 9, 2011

(65) Prior Publication Data

US 2011/0194091 A1    Aug. 11, 2011

Related U.S. Application Data

(63) Continuation of application No. PCT/EP2009/005808, filed on Aug. 11, 2009.

(60) Provisional application No. 61/087,890, filed on Aug. 11, 2009.

(30) Foreign Application Priority Data

Aug. 11, 2008   (DE) .......................... 10 2008 037 186

(51) Int. Cl.
*G03B 27/54*   (2006.01)
*G03F 7/20*    (2006.01)

(52) U.S. Cl.
CPC ........ *G03F 7/70916* (2013.01); *G03F 7/70833* (2013.01); *G03F 7/70883* (2013.01)

(58) Field of Classification Search
CPC ............ G03F 7/70833; G03F 7/70916; G03F 7/70883; G03F 7/702; G03F 7/70841

USPC .......................................... 355/67, 53; 359/509
See application file for complete search history.

(56) References Cited

U.S. PATENT DOCUMENTS

| 6,549,270 | B1 | 4/2003 | Ota |
| 6,593,585 | B1 | 7/2003 | Loopstra et al. |
| 6,750,949 | B2 | 6/2004 | Loopstra et al. |
| 6,864,988 | B2 | 3/2005 | Hof et al. |
| 7,221,460 | B2 | 5/2007 | Ohtsuka |
| 7,483,223 | B2 | 1/2009 | Egle et al. |

(Continued)

FOREIGN PATENT DOCUMENTS

| DE | 10 2006 044 5 | 4/2008 |
| EP | 1 457 834 | 9/2004 |

(Continued)

OTHER PUBLICATIONS

International Search Report and a Written Opinion from the counterpart PCT Application No. PCT/EP2009/005808, mailed Feb. 2, 2010.
German Office Action with English translation for corresponding DE Appl No. 10 2008 037 186.6, dated Apr. 8, 2009.

*Primary Examiner* — Peter B Kim
(74) *Attorney, Agent, or Firm* — Fish & Richardson P.C.

(57) ABSTRACT

An optical arrangement has a plurality of optical elements capable of transmitting a beam. A partial housing is provided which extends from a surface of an optical element in the direction of the beam emanating from the optical element, or of the beam incident on the optical element, and whose shape is adapted to the shape of the beam. The partial housing is surrounded at least partially by a measurement structure which is mechanically decoupled therefrom. The measurement structure has at least one sensor.

40 Claims, 9 Drawing Sheets

(56) References Cited

U.S. PATENT DOCUMENTS

| | | |
|---|---|---|
| 2003/0197914 A1* | 10/2003 | Cox et al. .................... 359/223 |
| 2004/0228012 A1 | 11/2004 | Sakamoto |
| 2005/0018154 A1 | 1/2005 | Box et al. |
| 2007/0222964 A1* | 9/2007 | Katsuhiko et al. ............ 355/71 |
| 2007/0285643 A1* | 12/2007 | Wedowski et al. ............ 355/67 |
| 2009/0135386 A1 | 5/2009 | Nishikawa |
| 2009/0141257 A1 | 6/2009 | Nishikawa |
| 2009/0231707 A1 | 9/2009 | Ehm et al. |

FOREIGN PATENT DOCUMENTS

| | | | |
|---|---|---|---|
| EP | 1 477 850 | 11/2004 | |
| EP | 1 513 018 | 3/2005 | |
| EP | 1 531 364 | 5/2005 | |
| JP | 07248522 A * | 9/1995 | ............ G03B 5/00 |
| JP | 2004-327807 | 11/2004 | |
| JP | 2005-251781 | 9/2005 | |
| WO | WO 2008/034582 | 3/2008 | |

* cited by examiner

Fig. 1 (Prior Art)

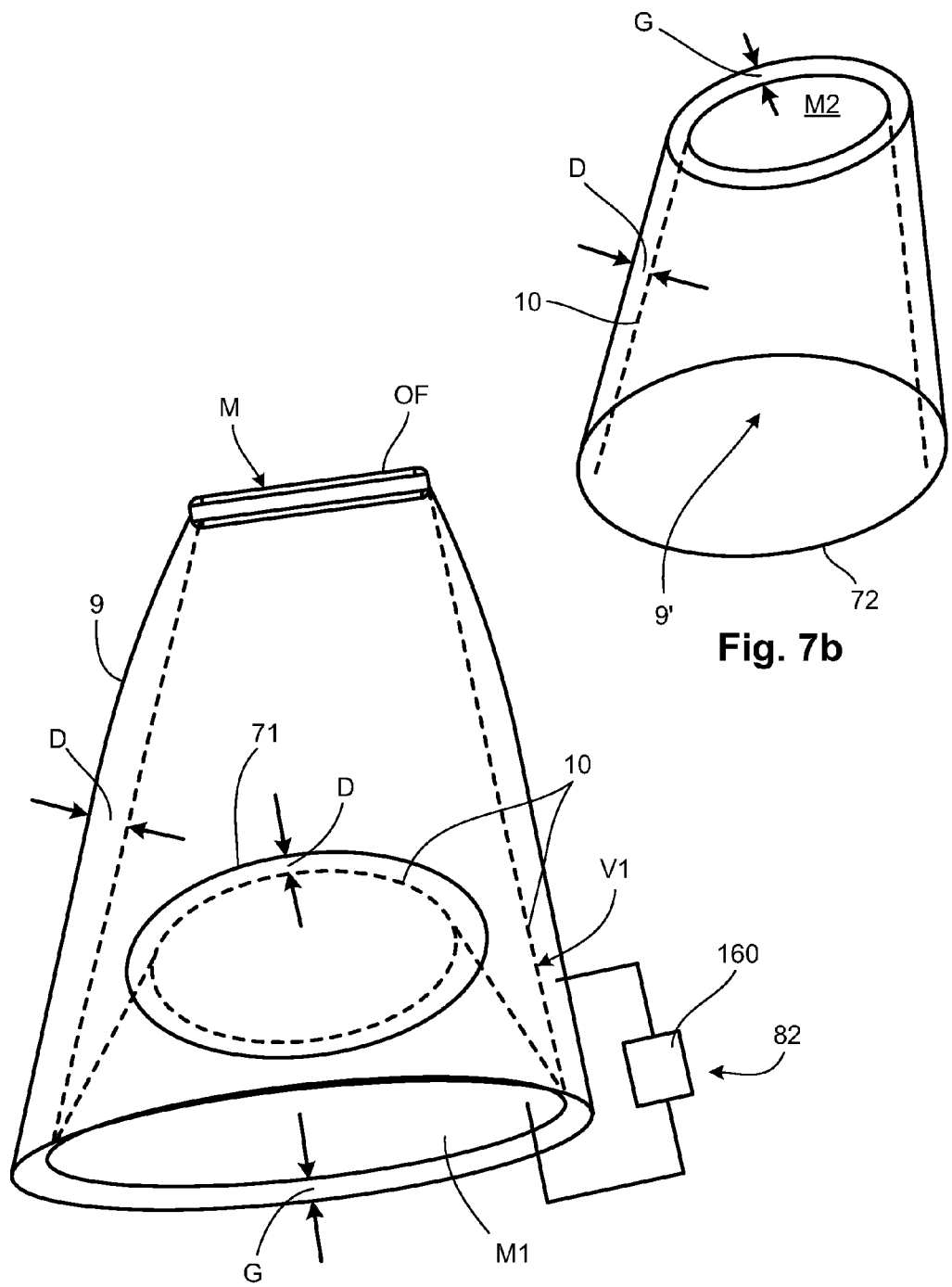

LOW-CONTAMINATION OPTICAL ARRANGEMENT

CROSS-REFERENCE TO RELATED APPLICATIONS

This application is a continuation of, and claims benefit under 35 USC 120 to, international application PCT/EP2009/005808, filed Aug. 11, 2009, which claims benefit of German Application No. 10 2008 037 186.6, filed Aug. 11, 2008 and U.S. Ser. No. 61/087,890, filed Aug. 11, 2008. International application PCT/EP2009/005808 is hereby incorporated by reference in its entirety.

FIELD

The disclosure relates to an optical arrangement, in particular a projection exposure system for semiconductor lithography or a part of such a projection exposure system such as, for example, a projection objective, which system or part offers good protection of reflecting surfaces against contamination, and thus against a reduction in the reflectivity of the surface.

BACKGROUND

Projection optics for EUV lithography generally include a plurality of reflective optical elements, that is to say mirrors, which are held in position relative to one another with a precision in the nanometer range or even below. In order to meet these high demands on precision and stability, and in order to provide possibilities to undertake fine optical setting to compensate long-term effects, one or more of the optical elements can be actuated and/or manipulated in up to six degrees of freedom. The optical elements or the mirrors and/or their associated actuators are held in the desired position in this case via a structure which is also termed the "lens barrel". Such a structure is disclosed, for example, in U.S. Pat. No. 6,750,949. In the document mentioned, both the actuators and the associated sensors are arranged on the same structure, the result of this being that a sufficient dynamic and thermal stability of the structure is ensured for the optics to function without trouble. It is usually desired to this end for the first natural frequency (or first eigenfrequency) of such a structure to be higher than the control bandwidth of the actuators, in particular higher by a factor of five. The thermal stability is selected such that under all conceivable conditions of use the image position is not displaced by more than one nm, displacements of below 0.5 nm between calibrations of the image position being better.

One alternative possibility is described in U.S. Pat. No. 6,864,988, in the case of which the abovementioned structure is split into two parts, a so-called force frame which absorbs static or dynamic loads, and a measurement structure which is also denoted as a metroframe or sensor frame and serves as a reference for a multiplicity of sensors with the aid of which the mirror position is measured. In this embodiment, the high dynamic and thermal demands apply only to the measurement structure and not to the force frame. In this case, the measurement structure is decoupled from the force frame both with respect to vibrations and to thermal influences such that the measurement structure determines the stability and/or the resistance of the projection optics to disturbance.

A third possibility is set forth in U.S. Pat. No. 7,221,460, in which one or more measurement structures are kinematically connected to the force frame. It is true that this variant does not have the theoretically ideal isolation properties of the abovementioned embodiment, but it is substantially easier to produce mechanically.

Moreover, U.S. Pat. No. 6,549,270, U.S. Pat. No. 6,593,585 and JP 2004-327807 describe various configurations of the design of actuators and sensors of such EUV projection optics.

It is common to all the abovementioned embodiments that the optical elements and, in particular, the surfaces of the optical elements are arranged in a common space with the sensors and actuators of the device, the result being that the service life of the optics can be substantially shortened because of contaminations which originate from the elements.

SUMMARY

The disclosure provides a device with improved suppression of the deleterious influence of contaminations on optical elements in optical arrangements, in particular in projection objectives for EUV semiconductor lithography. The disclosure also provides an EUV projection exposure system which exhibits such suppression of contamination influences.

An EUV projection exposure system includes an optical arrangement, which includes a plurality of optical elements each with a body. The body includes at least one reflective surface to transmit a beam which projects an object to an image. Further, the arrangement includes a first partial housing which extends from at least one reflective surface of a first optical element from the plurality of optical elements into a direction of the beam which incidents and/or is reflected on the reflective surface of the first optical element. The shape of the first partial housing is adapted to the shape of the beam and to the shape of the first optical element such that the first partial housing surrounds the beam in the respective direction or directions, and such that the first partial housing surrounds the at least one reflective surface of the first optical element with a gap between the first partial housing and the body of the first optical element. Additionally the first partial housing is constructed to fully support at least the first optical element by a first mounting.

An optical arrangement can include a plurality of optical elements capable of transmitting a beam. Further, the arrangement can include at least one partial housing which extends from a surface of at least one of the optical elements in the direction of the beam emanating from the at least one optical element or in the direction of the beam incident on the at least one optical element. In this case, the shape of the partial housing is adapted to the shape of the beam, and the at least one partial housing is completely or partially surrounded by a measurement structure which is respectively mechanically or mechanically and thermally decoupled from the partial housing. The measurement structure or the at least one optical element can includes at least one sensor or at least one component of a sensor for the determination of the position and/or of the orientation of the at least one optical element relative to the measurement structure. The sensor in particular is a position sensor. The partial housing can, in particular, also be completely surrounded by the measurement structure as mentioned, in this case preferably mechanical decoupling of the measurement structure and partial housing is of advantage.

A partial housing within this document is a housing which is designed to surround a partial volume of a beam which projects an object to an image.

In other words, the partial housing gives rise to a type of "mini-environment". The volume of the partial housing is optimized in this case to the effect that it exactly or just encompasses the surface of the optical element and the beam which emanates from this surface or is incident on this surface. The space in the partial housing for the beam can in this case involve a proportion of, in particular, 70% to 99% of the entire volume of the partial housing. The mini-environment therefore creates an efficient shielding of the spatial region traversed by radiation against a possibly contaminating environment, as a result of which the service life of the optical elements used can be substantially lengthened. Besides this general explanation of how the partial housing is adapted in accordance with the present disclosure a more detailed explanation is given below in connection with FIG. 7. In particular, as a result of the mini-environment, components which cause contamination such as, for example, the optically irrelevant surfaces of the optical elements, actuators, position sensors, cables, mounts, connecting elements or mechanical couplings or the like are effectively shielded from the optical surfaces of the optical elements. This shielding is desirable, in particular, in those cases where use is made as optical elements of mirrors such as are employed, for example, to operate an EUV projection exposure system.

The arrangement of the contaminating components that has been outlined above has, moreover, the positive effect that the components thereby become effectively accessible such that, for example, escaping outgassings can be efficiently evacuated.

As a further measure for avoiding contamination of the optically active surfaces, it can be provided to allow a purging gas to flow through the partial housing continuously, or else intermittently. In this case, the purging gas should have an adequate optical transmittance in the EUV wavelength region. Hydrogen at low pressure has proved to be particularly suitable for this.

Here, the partial housings can have small openings or windows, in particular for the entry and exit of optical radiation. Furthermore, it can be desirable to provide, in the region between the partial housing and the optically active surface, that is to say one to which useful optical radiation is applied, of the optical element, a small gap which acts as a gap seal and protects the optically active surface of the optical element against deformations by the environment. If appropriate, inlet and outlet openings for the purging gas are also to be provided.

In those cases in which the optical arrangement includes interchangeable optical elements such as, for example, aperture stops, gap seals should also be provided in the region of the interchangeable optical elements.

The disclosure enables components of the optical arrangement such as interchangeable optical elements and/or aperture stops, thermal control elements or actuators to be arranged on the partial housing. In other words, the partial housing, or a structure consisting of a plurality of partial housings, is used as support structure, that is to say as force frame. The imaging mirrors used in EUV projection exposure systems are held in position in this case by the use of contactless force actuators such as, for example, Lorentz actuators, without making mechanical contact with the partial housing. An exception can be made in this case for the mirror which is adjacent in space to the wafer and can come into mechanical contact with the partial housing. The significance of the dynamic behavior of the support structure is made to fade into the background in this case by the use of contactless force actuators. This opens up the possibility of arranging on the support structure, that is to say on the partial housing, further functional elements which could lead to dynamic disturbances. Examples of this are water conduits, inlets and outlets for purging gas, cables or similar. Moreover, the support structure can be connected, for example, to the frame of a projection exposure system which is not isolated from vibration. In addition, there is the possibility of arranging the support structure as well as the measurement structure on the metroframe, that is to say a frame which is isolated from vibration and on which the scanner table of the projection exposure system is also located.

As already mentioned, the measurement structure or the sensor frame is arranged outside the support structure. The measurement structure ensures that position sensors and/or measurement systems, including also the nonactuated mirror, are fixed relative to one another and to a reference frame of a system in a fashion that is thermally and mechanically or dynamically stable. As already mentioned, the use of contactless force actuators leads to the fact that the keeping of the optical elements in the exact position depends virtually exclusively on the stability of the sensor frame and not on that of the force frame, the result being a reduction in the mechanical demands on the force frame. The use of the measurement structure thus particularly enables the support structure to be designed as a partial housing or as a combination of partial housings, since the design restrictions stemming from the high mechanical demands on the support structure no longer exist in the case of the use of a separate measurement structure. Conversely, the use of the partial housings, which as regards their overall space have shrunk to the minimum dimension to shield the optical surfaces and the optical path, creates for the first time the possibility of implementing the measurement structure in a way that it surrounds the partial housings which substantially form the support structure.

The structure of the partial housing insulates the surrounding measurement structure efficiently against the thermal radiation which is emitted by the optical elements heated owing to the optical radiation used. There is, in addition, a positive effect of selecting for the partial housing a material of high thermal conductivity such as, for example, a metallic material such as stainless steel or aluminum; the use of other—nonmetallic—materials of high thermal conductivity is also conceivable. The advantageous possibility is also opened up of grounding the partial housing thermally via a water cooler; a temperature of 22° C. is suitable to this end. The high thermal conductivity of the selected material has an advantageous effect in this case on the effectiveness of the water cooler.

A further advantage in the use of materials of high thermal conductivity is, particularly also for the measurement structure, that a comparatively homogenous temperature distribution is quickly set up in such materials, thus opening up the possibility of operating with a set of temperature sensors which exhibits a lower spatial resolution by comparison with the use of slightly (or low) thermally conductive substances. The result of this is the possibility of making a reliable statement relating to the temperature distribution in the measurement structure, a comparatively small number of thermal sensors sufficing to this end.

The partial housing can consist at least partially of electropolished stainless steel, the good processability of the stainless steel coming to bear advantageously in terms of production engineering. In addition, contamination is thereby reduced and the robustness of the partial housing to hydrogen gas is raised. In particular, a number of partial housings can be connected, in particular screwed, to one another such that virtually the entire optical path is surrounded by the partial housing. The screwed (in general mechanically connected) partial housings can be at least partly or completely surrounded by the measurement structure.

Values of more than 200 Hz are advantageous for the natural mechanical frequency of the measurement structure.

Furthermore, it is recommended to select for the measurement structure a material with a thermal conductivity of more than $$100 \frac{W}{mK}$$

and a coefficient of thermal expansion of less than 5 ppm/K.

Lightweight building materials are suitable overall for the sensor frame (or measurement structure); they exhibit a high degree of rigidity in conjunction with a small coefficient of thermal expansion and good thermal conductivity. Examples that may be named are fiber-reinforced, in particular carbon-fiber-reinforced, PEEK or epoxy resin with nickel coating for reducing the outgassing, fiber-reinforced, in particular carbon-fiber-reinforced, ceramics, cordierite, Zerodur, ULE, Invar or silicon carbide or silicon/silicon carbide.

Moreover, the partial housing can have a heat exchanger, in particular a water cooler. It is true, as set forth above, that the thermal stability of the partial housing or the support structure plays only a subordinate role. The advantage of cooling resides in that the measurement structure can be further shielded against thermal influences which could originate, for example, from the surface of the optical elements which is heated owing to the radiation. Consequently, the inventive partial housing embraces at least three partial functions: firstly, it serves as a support structure for the optical elements and further components of the device; moreover, it creates the "mini-environment" for suppressing contamination; and, finally, it acts as a heat shield. Depending on the particular application, these functionalities can be given a different weighting which has a corresponding effect on design.

In order to manipulate the optical elements, it is advantageously possible to use contactless force actuators which are arranged on the partial housing and, for their part, may have a heat exchanger, in particular a water cooler. In this case, the water cooler of the force actuators can have a dedicated cooling circuit. This measure has the further effect that the actuators can be of stronger design, having e.g. a higher actuation force or power, in conjunction with non-cooled actuators of the same size.

Furthermore, the measurement structure can have at least one temperature sensor for determining the temperature at a location of the measurement structure, a control/regulating unit being connected to the temperature sensor and to at least one Lorentz actuator, and the control/regulating unit being suitable for undertaking a correction of thermally caused deformations of the measurement structure via the at least one Lorentz actuator on the basis of the temperatures measured by the temperature sensor. This correction can be performed purely on the basis of a model in conjunction with knowledge of the mechanical parameters of the measurement structures. It is thus possible to store in the control/regulating unit a mechanical model of the measurement structure which can be used to determine the resulting deformations of the measurement structure on the basis of the measured temperatures, and to undertake a corresponding correction via the actuators solely on the basis of the data determined from the model.

In addition, the measurement structure can be surrounded at least partially by a heat shield, in particular with a temperature of 22° C., for suppressing thermal influences from the environment, the result being to further increase the robustness of the inventive device, in particular against external thermal influences.

As already mentioned, the disclosure can be used with particular advantage in projection exposure systems for semiconductor lithography, in particular in an EUV projection exposure system, or in a part of such a projection exposure system.

Further features, advantages and improvements of the present disclosure will become apparent from the following detailed description of exemplary embodiments with reference to the following drawings. However, the following description of the disclosure by exemplary embodiments is merely illustrative and in no way intended to limit the disclosure and its application. As will be shown, features of different embodiments can be exchanged and/or combined to get additional embodiments of the disclosure which also holds for the following exemplary embodiments.

BRIEF DESCRIPTION OF THE DRAWINGS

The disclosure is further explained below with the aid of the drawing, in which:

FIG. 7a shows schematically in a perspective view a first partial housing which is designed to surround the first partial volume as shown in FIG. 6;

FIG. 7b shows a further, a second partial housing adapted to surround the second partial volume, as described in FIG. 6;

In figures the same elements are designated with the same reference numerals.

DETAILED DESCRIPTION

Figure 1:
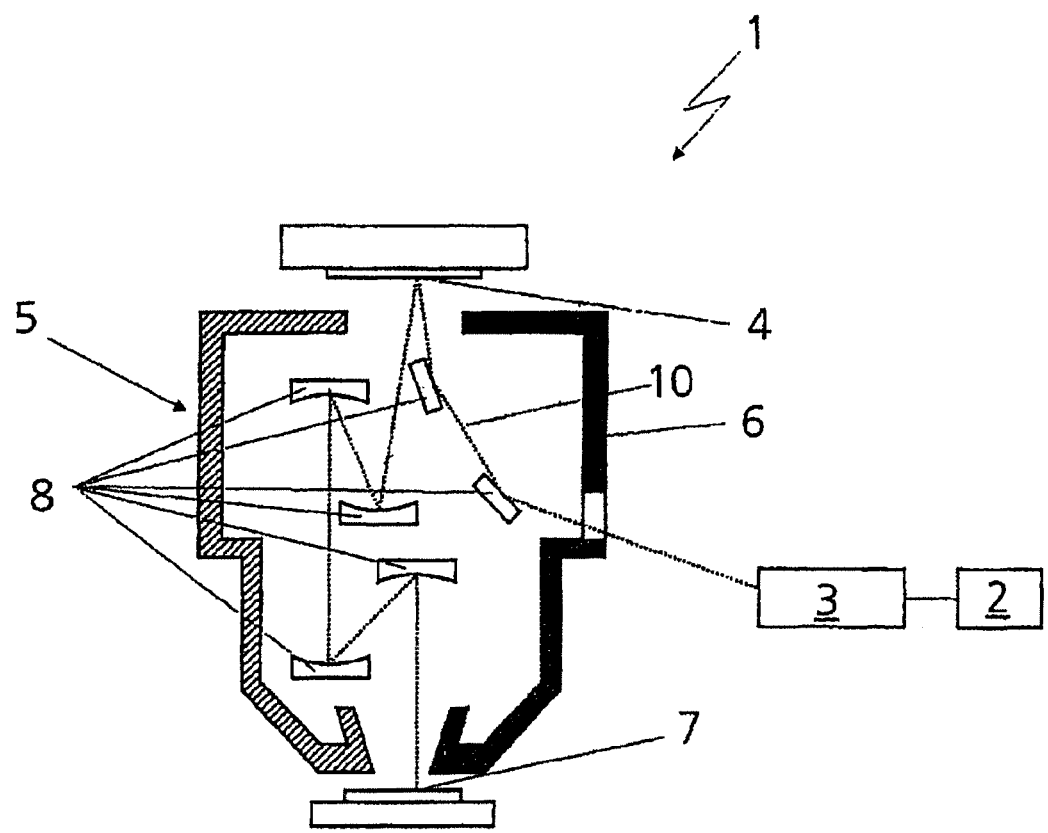
FIG. 1 shows a design principle of an EUV projection exposure system with a light source, an illumination system and a projection objective.

FIG. 1 illustrates an EUV projection exposure system 1 according to the prior art with a light source 2, an EUV illumination system 3 for illuminating a field in an object plane 4, in which a structured mask is arranged, as well as a projection objective 5 with a housing 6 and a beam 10 for imaging the structured mask in the object plane 4 onto a photosensitive substrate 7 for producing semiconductor components. The projection objective 5 has optical elements designed as mirrors 8 for the purpose of beam formation. The illumination system 3 also has such optical elements for beam formation and beam guidance. However, these are not shown in more detail in FIG. 1.

Figure 2:
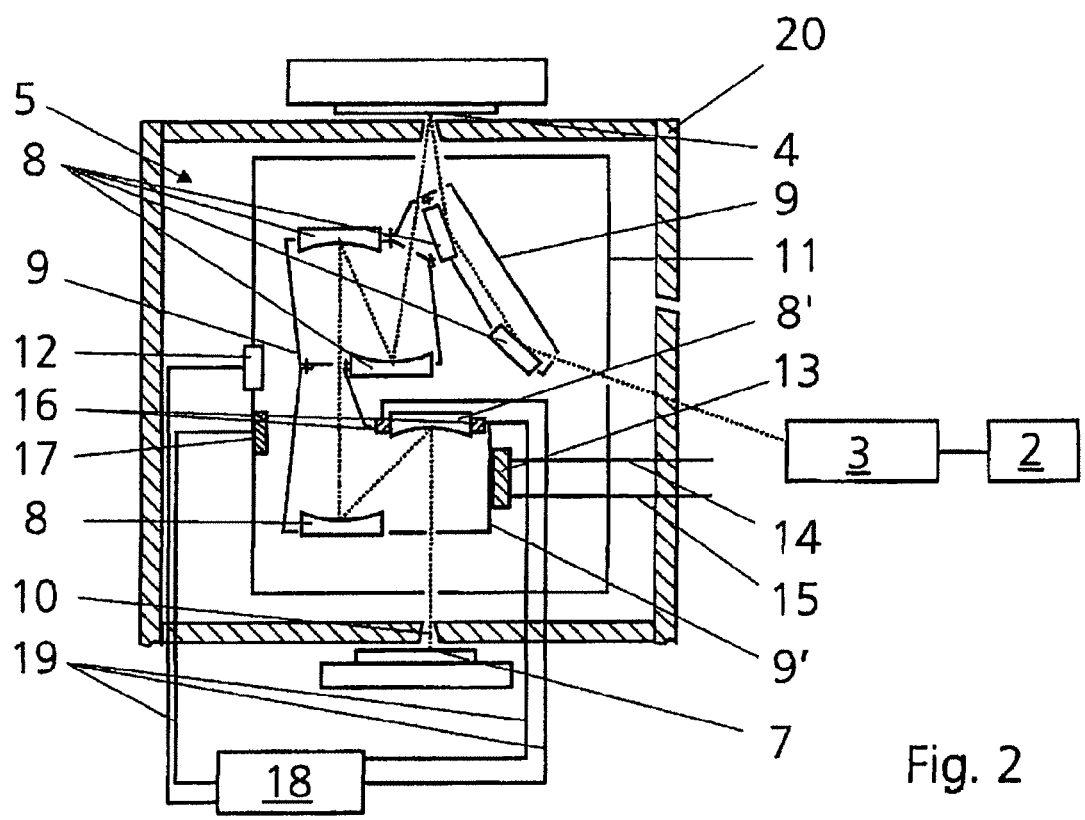
FIG. 2 shows a projection exposure system for semiconductor lithography, in the case of which the inventive concept has been implemented.

FIG. 2 shows a projection exposure system for semiconductor lithography, in the case of which the inventive concept is implemented. The EUV projection exposure system illustrated in FIG. 2 differs from the system according to the prior art illustrated in FIG. 1 in that the optical elements 8, 8' are surrounded by the partial housings 9, 9' such that the optical path 10 is encapsulated. The partial housings 9, 9' in this case surround the optical elements 8, 8' to such an extent that the optically active surfaces of the optical elements 8, 8' are surrounded by the partial housings 9, 9'. In particular, it is possible for there to remain between the partial housings 9, 9' and the optical elements 8, 8' a gap which enables a movement of the optical element 8, 8' in relation to the partial housing 9, 9' without mechanical effects occurring on the partial housing 9, 9', or on the optical elements 8, 8'. Such a gap has a typically width in the range of 0.5 mm to about 5 mm. The width gives the shortest distance between the partial housing 9, 9' and the surface (or body) of the optical element 8, 8'. As is illustrated by way of example with the aid of the optical element 8', the optical element 8' can be held without touching via contactless force actuators 16. The partial housings 9, 9' are in this case screwed to one another at their contact points. The arrangement composed of the partial housings 9, 9' and the optical elements 8, 8' is further surrounded by a measurement structure 11 which, by way of example, supports the position sensor 12 and the temperature sensor 17. The position sensor 12 serves in this case to determine the location of the optical element 8' relative to the measurement structure 11, and can be designed, by way of example, as a contactless sensor; the temperature sensor 17 enables the temperature to be determined in the region of the measurement structure 11 surrounding it. It may be seen from FIG. 2 that the partial housings 9 and 9' connected to one another form overall a support structure, that is to say a force frame, for the optical elements 8 and 8'. Moreover, the partial housing 9' supports the water cooler 13 in addition to its supply and discharge conduits 14 and 15, respectively. When the geometry of the measurement structure 11 changes owing to thermal effects, the change in geometry of the measurement structure 11 which results therefrom can be determined from the measured values which are determined by the temperature sensor 17, which is arranged on the measurement structure 11. In order to determine the change in geometry of the measurement structure 11, it is possible, in particular, to use a model, stored in the control/regulating unit 18, of the thermomechanical behavior of the measurement structure 11. The change in geometry of the measurement structure 11 thus calculated can then be taken into account for determining the position of the optical elements 8, 8'. The entire arrangement composed of measurement structure 11 and partial housings 9 and 9' is surrounded by the heat shield 20 for the purpose of thermal shielding from external influences which originate from the environment.

Figure 3:
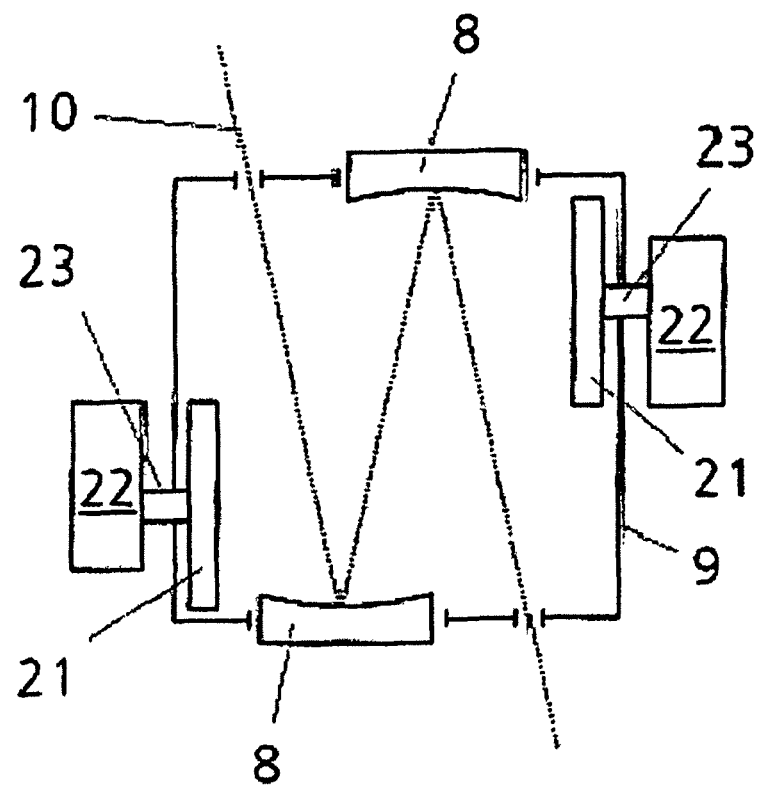
FIG. 3 shows a partial housing according to one embodiment of the present disclosure.

FIG. 3 shows an embodiment of the disclosure in which exemplarily a partial housing 9 is shown which is designed in an extra robust way against thermal effects, resulting from the heating optical elements 8, or resulting form other local heat sources or radiation sources. Again the partial housing 9 is designed as a "mini-environment" which forms a force frame or support structure to support the optical elements 8 and potential further components. In the partial housing 9, shown in FIG. 3, there are arranged plate- or disc-shaped elements 21 which may include e.g. aluminum and which in general are manufactured from a metal. The elements 21 shield at least parts of the partial housing 9 against thermal radiations which are e.g. emitted by the heating optical elements 8 or other thermal radiation sources. Such other thermal radiation sources are for example actuators, even if the actuator devices are outside the "mini-environment" 9 as they are in accordance with one embodiments of the present disclosure. The disc-shaped elements warm up itself such that heat is dissipated from them. This happens by the thermal conductors 23 which may be made of materials with high thermal or extra high thermal conductivity. The thermal conductors 23 itself are connected with cooling units 22 by which the resulting heat is conducted to the surrounding area.

Figure 5:
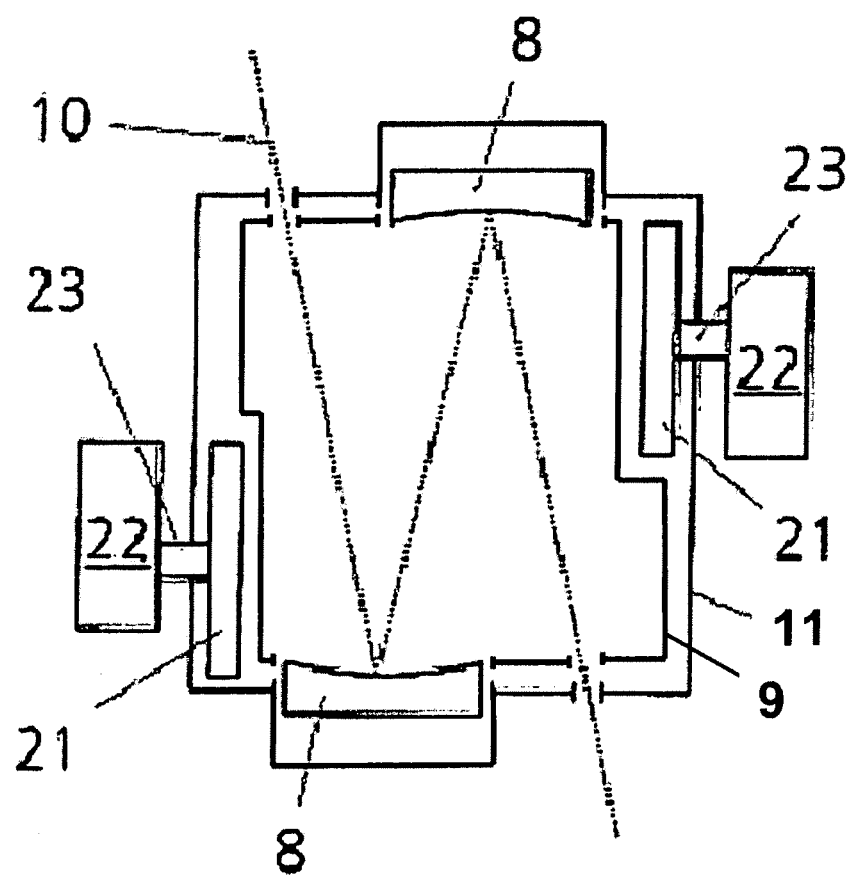
FIG. 5 shows a partial housing according to one embodiment of the present disclosure in which the partial housing is also thermally decoupled from a measurement structure.

FIG. 5 shows an alternative embodiment of the disclosure which is similar to the embodiment described in FIG. 3, but in which the plate- or disc-shaped elements 21 are arranged between the measurement structure 11 and the partial housing 9. This has the advantage that the measurement structure 11 is thermally shielded from the partial housing 9, especially if any actuators are mounted outside the partial housing 9 as they are in accordance with some embodiments of the present disclosure.

It was already mentioned that in accordance to one embodiment of the present the partial housing 9 also forms the support structure or force frame for the mounting of the optical elements 8. In general such a support structure is mechanically decoupled from the measurement structure 11 which is e.g. the case in the embodiment shown in FIG. 3. In the embodiment shown in FIG. 5 the partial housing 9 is mechanically and thermally decoupled from the measurement structure 11. With such an embodiment of the present disclosure advantageously the accuracy of measurement, like e.g. a position and/or an orientation measurement and/or a deformation measurement of an optical elements 8, can be further improved.

Figure 4:
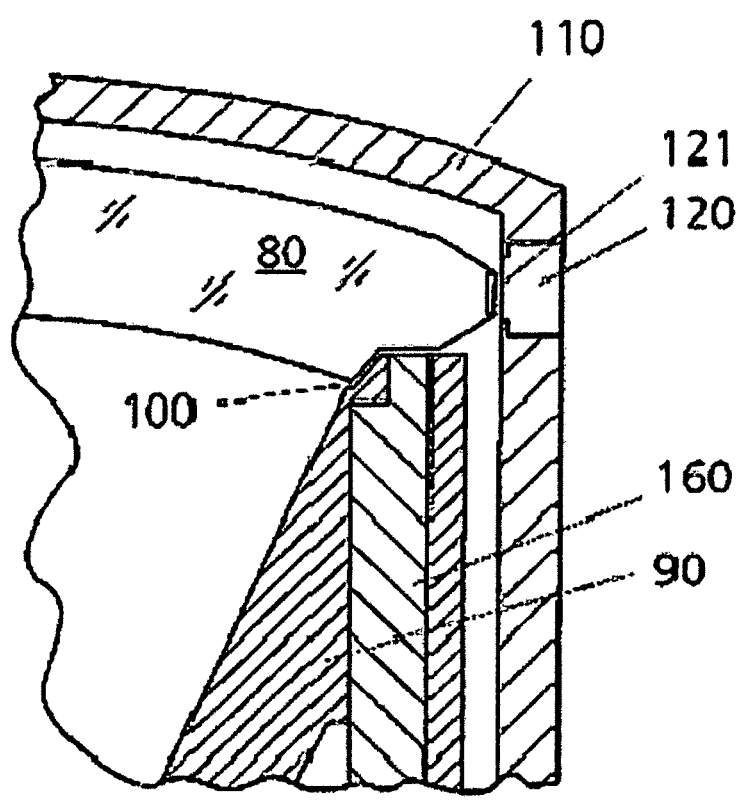
FIG. 4 shows schematically a detail of an embodiment of the present disclosure.

FIG. 4 exemplarily shows an embodiment of the disclosure in which the optical device or arrangement is designed as a part of an EUV projection exposure system for semiconductor lithography. There the conditions in the area of the optical element 80, in the present case a mirror 80 which optionally is coated with at least one coating, is shown. In the shown example the coated mirror 80 is contactless positioned or fixed relative to the partial housing 90 by an actuator 160. Thereby a gap 100 is formed between the coated mirror 80 and the partial housing 90. The assembly of the coated mirror 80, the partial housing 90 and the actuator 160 thereby is surrounded by a measurement structure 110. The measurement structure 110 includes a position sensor 120 for a contactless measuring of at least one degree of freedom of the mirror 80. In general various embodiments of the present disclosure are possible as alternatives or as combinations with the previous described embodiments in which the measurement structure 11, 110 and/or the first partial housing 9, 90 and/or the first optical element 8, M1 (see FIG. 6) includes at least one sensor 160 and/or at least one component of a sensor.

According to one embodiment of the present disclosure the measurement structure 11, 110 at least partly surrounds the first partial housing 9, 90 as it is also schematically shown in FIG. 4. Alternative or in addition the measurement structure 11, 110 is mechanically or mechanically and thermally decoupled from the first partial housing 9, 90. This has the advantage that any measurement of e.g. a relative position and/or orientation of the partial housing 9, 90 or any objects mounted thereon, like e.g. the at least one optical element 8, M1, relative to the measurement structure 11, 110 can be done with higher precision. To make fully use of the higher measurement precision advantageously the measurement structure 11, 110 has a lowest eigenfrequency of mechanical vibrations in a frequency band selected from the group consisting of higher than 150 Hz, higher than 300 Hz, higher than 600 Hz, higher than 1000 Hz or higher than 1500 Hz.

As shown in FIG. 4 the measurement structure 110 can be further adapted to the outer contours of the partial housing 90 and/or the optical element 80. Due to this a distances between a reference face 121, which is located on the optical element 80, and the contactless position sensor 120 can be made small, like e.g. smaller than 50 mm, especially smaller than 20 mm. Such a small distance allows the usage of an optical encoder as a contactless position sensor 120. Such encoders have the advantage to measure in at least one degree of freedom, or in at least one direction, a relative position of the optical element 80 relative to the measurement structure 110 with an accuracy of better than 100 pm (100 picometer), if the scale or pattern of the encoder and the sensor-arrangement (usually including a light source and a sensor) of the encoder for reading the scale or pattern have a distance relative to each other of less than 50 mm. Advantageously the scale or pattern of the contactless sensor 120, if designed as an encoder, is formed on or is attached to the reference face 121 of the optical element 80, while the sensor-arrangement of the sensor 120 is attached to the measurement structure 110.

In an alternative embodiment of the disclosure, not shown in FIG. 4, the partial housing 90 may at least partly surround the optical element 80. In this case respective windows or openings are provided in the partial housing 90 such that the contactless sensor 120 is able to measure the spatial position and/or orientation of the optical element 80 relative to the measurement structure 110.

In FIG. 4 in addition schematically an actuator 160 is shown. Preferably the actuator 160 is a contactless actuator like a Lorentz actuator which is arranged outside of the partial housing 90. This has the advantage that any source of outgasing chemicals, which are caused by the actuator or the materials and components of the actuator and/or the mounting, and which can cause a contamination of the optical elements, are arranged outside of the mini-environment which is formed by the partial housing 90. A further advantage of the actuator arrangement outside the partial housing 90 is that the actuator arrangement is good accessible for service and/or replacement. In the case of the usage of a contactless actuator like a Lorentz actuator, the optical element 80 is actuated in a contactless way which is schematically shown also by the gap 100.

Alternative or in addition (not shown in FIG. 4) an actuator which contacts the optical element 80 in a direct or an indirect way can be used for the actuation and/or deformation of the optical element 80, but the actuator still is arranged at the outside of the partial housing 90.

Figure 6:
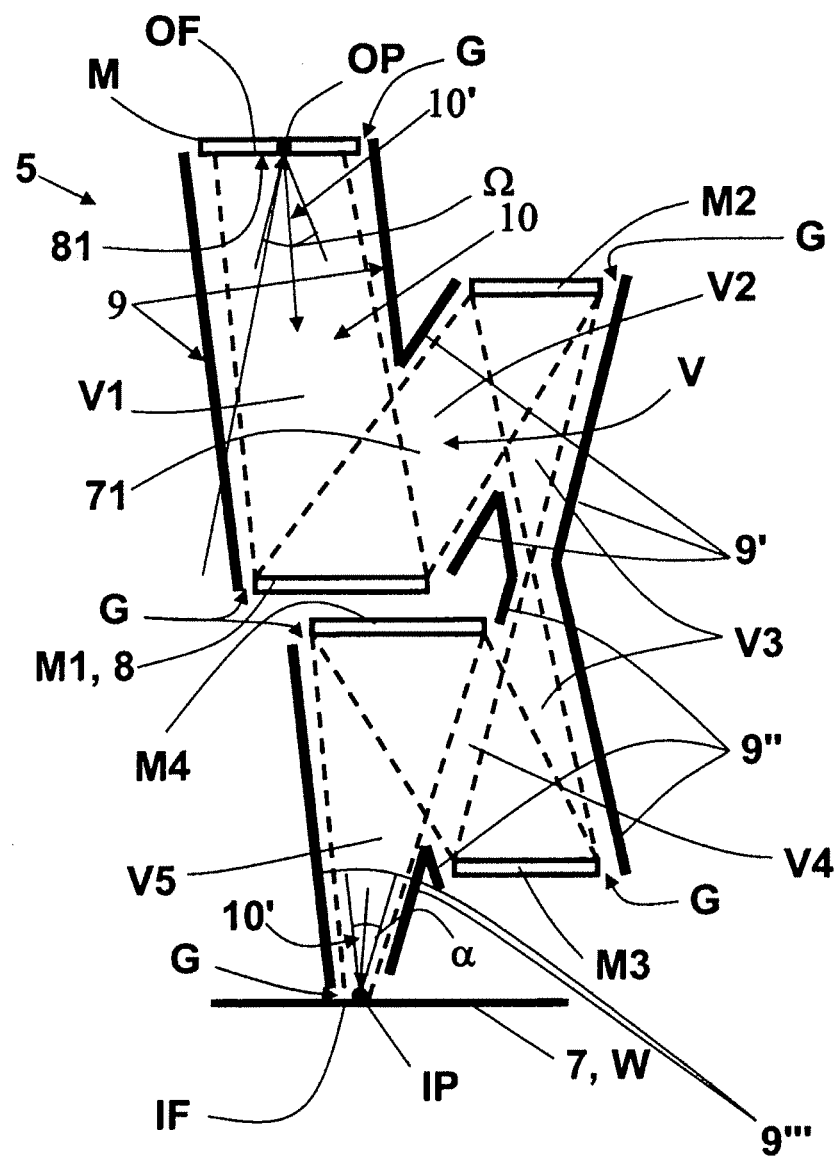
FIG. 6 shows an optical assembly according to the disclosure with partial housings which are adapted to the projection beam with various partial volumes, and which are adapted to the mirrors of the assembly.

The above mentioned (see FIG. 2) encapsulation of the optical path or beam path 10 by the partial housings 9, 9' is described in more detail in FIG. 6.

FIG. 6 shows an optical arrangement of an EUV projection exposure system like a projection objective 5 in accordance with the present disclosure. The shown optical arrangement includes a plurality of optical elements M1, M2, M3, M4 each with a body. The body of each optical element M1, M2, M3, M4 includes at least one reflective surface 81 (see FIG. 8) to transmit a beam 10 trough the optical assembly 5. The beam 10 optically projects an object OF into an image IF. In FIG. 6 it is further shown how the partial housing 9 (9', 9", 9'") is adapted to the shape of the optical path or beam path 10 and/or to at least one (a first) optical element 8 in accordance with the present disclosure. FIG. 6 shows schematically how an object point OP on a structure like a mask M is projected to an image point IP which is on a photosensitive substrate 7 like a semiconductor wafer W. This projection is done by a projection objective 5 of an EUV projection exposure system with a projection beam 10. The projection Beam 10 consists of a bundle of rays 10' of which only parts of the bundle of rays 10' nearby the object point OP and nearby the image point IP is shown in FIG. 6. FIG. 6 shows as an example an objective 5 with 4 mirrors M1, M2, M3 and M4 as optical elements 8, 8'. The four mirrors are arranged along the propagation direction of the beam 10 such that the first mirror M1 acts as the first reflective surface after the beam 10 has passed the object point OP, and the mirror M4 acts as the last reflective surface just before the image point IP is formed. As shown in FIG. 6, the first mirror M1 not necessarily is also the mirror which is next to the object point OP or next to the mask M. In the shown objective 5 the second mirror M2 is much closer to the object point OP and so M2 is the next mirror to the object point OP or the mask M. The mirrors M3 and M4 behave similar regarding their distances to the image point IP.

The objective 5 has a numerical aperture NA which determines among other parameters the resolution limit of the objective 5, and which is expressed by NA=sin($\alpha$), wherein a designates the angle of aperture of the bundle of rays 10' at the image point IP. Usually the objective 5 has a magnification factor $\beta$ which results in that the bundle of rays 10' at the object point OP has an angle of aperture $\Omega$ different from $\alpha$. Such the numerical aperture NAO in the object point is given by NAO=sin $\Omega$ with NAO=NA*|$\beta$|. Usually the absolute value of the magnification factor |$\beta$| is in the range of about 0.25. In such a case the numerical aperture NAO in the object point OP is NAO=0.25*NA. In this example the angle of aperture $\Omega$ of the bundle of rays 10' in the object point OP is smaller than the angle of aperture $\alpha$ in the image point IP.

It is mentioned that the way of propagation of the bundle of rays 10' from an object point OP to an respective image point IP is also defined by the location of the aperture or aperture stop (or pupil) of the projection objective 5. Especially the directions of the chief rays or the directions of the energetically central rays of the bundles of rays 10' depend at the object points OP and at the image points IP on the location of the mentioned aperture which depend on the optical design of the projection objective 5.

Further, the mentioned way of propagation of the bundle of rays 10' also depend on the illumination conditions, of how the object points OP are illuminated.

During the lithographic projection process usually an object field OF (or object) on the mask M is projected into an image field IF (or image) on the wafer W. From each object point OP of the object field OF a bundle of rays 10' with—in a first approximation—an angle of aperture $\Omega$ propagates to a respective image point IP on the image field IF. The image points IP have (in a first approximation) an angle of aperture of $\alpha$ (given by the numerical aperture NA of the projection objective 5), as described above. The sum or integration of all bundles of rays 10' of all object points OP of the object field OF forms the beam 10 which is transmitted through the projection objective 5 by the mirrors M1, M2, M3, M4 (or the optical elements) to project the object onto the wafer where the image is formed. The beam or transmitted beam 10 is shown schematically in FIG. 6. This beam 10 has a cross-section perpendicular of the propagation of the centre of energy of this beam 10. This cross-section depends on the position along a propagation way formed by the propagation of the centre of energy of the beam 10. These cross-sections form a volume V of the projection beam 10 along the propagation way from the object OF to the image IF. This volume V of the projection beam 10 can be partitioned into partial volumes. FIG. 6 shows an example of such a partition. A first partial volume V1 is formed by integration of the cross-sections of the beam 10 along the propagation way between the mask M and the first mirror or first optical element M1. A second partial volume V2 is formed by integration of the cross-sections of the beam 10 along the propagation way between the first mirror or first optical element M1 and the second mirror or second optical element M2. Further, $3^{rd}$ and $4^{th}$ partial volumes V3 and V4 are formed by integration of the cross-sections of the beam 10 along the propagation way between the second mirror M2 and the third mirror M3, and between the third mirror M3 and the fourth mirror M4. In addition a $5^{th}$ partial volume V5 is formed by integration of the cross-sections of the beam 10 along the propagation way between the fourth mirror M4 and image filed IF or image on the wafer W.

In accordance to the present disclosure at least one partial housing 9, 9', 9'', 9''' (see FIG. 6), also designated as first partial housing, extends from a surface, preferably a reflective surface, of at least one optical element like a mirror 8, M1, M2, M3, M4 into the direction of the beam 10 which incidents and/or which is reflected on a surface or on the reflective surface of the at least one optical element, also designated as first optical element. The shape of the first partial housing 9 is adapted to the shape of the beam 10. This adaptation is such that the at least one or first partial housing 9 surrounds the beam 10 in the respective direction or directions. This means that the partial housing 9 surround at least a respective partial volume V1 of the beam 10. As a consequence the smallest distance between the outer surface of the partial volume V1 of the beam 10 and the inner surface of the respective partial housing 9 is selected larger than about 1 mm to reduce any diffused light on the one side and to have not too tight mechanical tolerances for the manufacturing of the partial housing 9 on the other side. In the case that the smallest distance is larger than 3 mm the generation of diffused light is further reduced. However, to form an efficient mini-environment such that any contaminations are efficiently suppressed, the smallest distance should be as small as possible, but this condition has the disadvantage that more diffused light is in the image. For this reason a compromise between an acceptable amount of diffused light in the image IF and a tolerable contamination within the partial housing 9 has to be chosen.

Experiments and calculations show that the smallest distance should be in the range of 1 mm to 10 mm, depending on the size of the volume of the partial housing 9. For lots of embodiments 3 mm to 5 mm are preferred. As a rule of construction, the distance variations D between the outer surface of the partial volume V1 of the beam 10 and the inner surface of the respective partial housing 9 should be selected within the mentioned ranges. This results in about a 1% to 30% larger volume for the partial housing 9 relative to the partial volume V1 of the beam 10.

The mentioned recommendation for the adaptation of the partial housing 9 to any partial volume V1 of the beam 10 is for the case that an aperture stop with the largest possible opening is applied in the projection objective 5, such that the highest numerical aperture NA at the image is achieved.

In the case that the aperture stop may be exchanged and thus may be replaced by an aperture stop with a smaller opening the above given distance variations D between the outer surface of a partial volume V1 of the beam 10 and the inner surface of the respective partial housing 9 will become larger and may exceed the above ranges or the above volume ratios. However in these cases the partial housings 9 of the present disclosure are still treated as adapted, if the adaptation was done with an aperture stop with the largest possible opening.

Further, according to the present disclosure the shape of the at least one or first partial housing 9 is adapted to the shape of the at least one or first optical element 8, M1 such that the first partial housing surrounds the at least one reflective surface of the first optical element with a gap G between the first partial housing and the body of the first optical element like a mirror M1. The gap G preferably has a width in the range between about 0.5 mm to about 5 mm or between 1 mm and 10 mm. This ranges of the width of the gap G represent variations of the width of the gap G from the shortest distance to the largest distance between the partial housing 9 and the surface (or body) of the optical element M1. Such gaps G are schematically shown in FIG. 6.

FIG. 7a schematically shows in a perspective view a first partial housing 9 which is designed to surround the first partial volume V1 as shown in FIG. 6. In the shown exemplary embodiment the object field or object OF in a good approximation has the shape of rectangle. Of course other shapes are also possible. Further, the beam 10 which projects the object OF to the image IF is shown with dashed lines. The partial housing 9 is adapted to the beam 10 between the mask M and the first mirror M1 as described above. The distance variation D between the outer surface of the partial volume V1 of the beam 10 and the inner surface of the respective partial housing 9 is also shown at various locations. Also the gap G between the mirror M1 and the partial housing 9 is shown. Further the partial housing 9 has an opening 71 to allow the beam 10 to exit the volume of the partial housing 9. In general the first partial housing includes at least one opening which serves as an inlet and/or outlet for the beam 10. The shape and size of the opening 71 depend on the optical design of the projection objective 5.

According to the present disclosure the first partial housing 9 is constructed to fully hold at least the first optical element or first mirror M1 by a first mounting 82 which will be described in more detail in connection with the description of FIG. 8. Additionally, the mounting 82 may include at least one actuator 160.

FIG. 7b shows a further, a second partial housing 9' adapted to surround the second partial volume V2, as described in FIG. 6. The second partial housing 9' surrounds the beam 10 and such the respective partial volume V2 and the second mirror M2 such that there is again a distance variation D between the outer surface of the partial volume V2 of the beam 10 and the inner surface of the respective partial housing 9' within the parameter ranges given above. Further, the gap G between the second mirror M2 and the second partial housing 9' is also shown.

In general the EUV projection exposure system according to the disclosure includes a second partial housing 9' or an additional partial housing. The shape of the second or additional partial housing is adapted to the shape of a part of the beam 10 along a part of its way of propagation. Additionally the shape is adapted to the shape of a further optical element M2 such that the second or additional partial housing) 9' surrounds a second additional partial volume V2 of a part of the beam 10. Further, the second or additional partial housing 9' surrounds the at least one reflective surface of the further optical element M2 with a gap G between the second or additional partial housing 9' and the body of the further optical element M2. In addition the second or additional partial housing 9' is constructed to fully support at least the further optical element M2 by a second or additional mounting 82. The second or additional mounting is formed in accordance to the various embodiments of the first mounting which is described in more detail together with FIG. 8. The second or additional mount can be also formed by combinations of this various embodiments of the first mount.

Figure 7C:
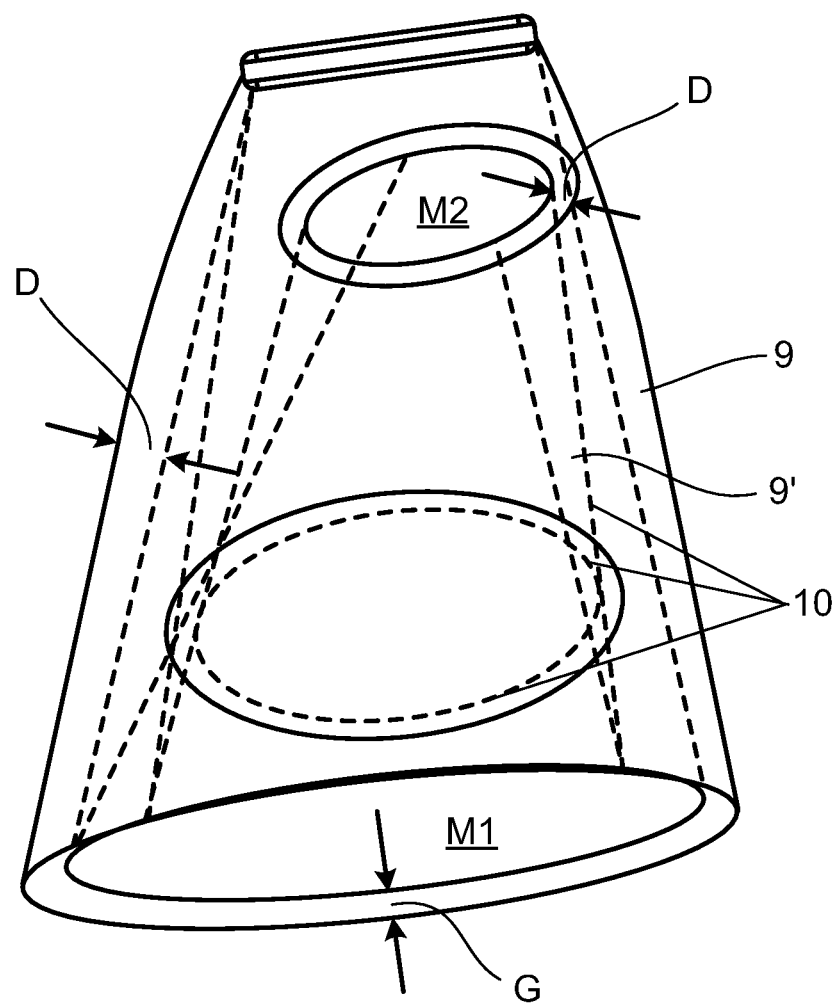
FIG. 7c shows the connection of the first and second partial housings shown in FIGS. 7a and 7b and FIG. 8 schematically shows a more detailed view of an embodiment of the present disclosure together with a mounting of a mirror.

Preferably, but not necessarily, the first and the second partial housings 9 and 9' are geometrically arranged in such a way relative to each other that they can be connected with each other, e.g. by a screwed joint. After the joining both partial housings 9, 9' form a new partial housing which is also adapted to the beam 10 in accordance to the present disclosure, but which includes two optical elements or mirrors M1, M2. The connected first and second partial housings 9, 9' are schematically shown in FIG. 7c in a perspective view. Additional partial housings 9" and 9'" may be connected to the second housing 9', as it is schematically shown in FIG. 6.

If each optical element of the optical assembly is surrounded by a partial housing in accordance to the disclosure as discussed in connection with FIGS. 6, 7a, 7b and 7c, and if all these partial housings are connected to each other, then the beam 10 and its volume is surrounded or almost surrounded by these partial housings. Such the connected partial housings, of which each surround at least a respective partial volume V1, V2, V3, V4, V5 of the projection beam 10, form a housing for the projection beam 10. In addition this housing forms a force frame or support structure for the optical elements as it will be described together with FIG. 8. Such in accordance with the present disclosure there is also an EUV projection exposure system which includes an optical arrangement, wherein the optical arrangement includes a plurality of optical elements each with a body. Each body includes at least one reflective surface to transmit a beam which projects an object to an image. This optical arrangement includes further a housing which respectively extends from the reflective surfaces of the optical elements into a direction of the beam which incidents and/or is reflected on the reflective surfaces of the optical elements. The shape of the housing is adapted to the shape of the beam. Also the shape of the housing is adapted to the shape of the optical elements. The adaptation is such that the housing surrounds the beam in the respective direction or directions, and the housing surrounds the at least one reflective surface of the optical elements with respective gaps between the housing and the body of the optical elements. In addition the housing is constructed such to fully support the optical elements by respective mountings. As explained above, the housing may including several partial housings in accordance to the embodiments of the present disclosure, or the housing is made out of one piece.

An additional embodiment of an optical arrangement of the present disclosure can be seen from FIG. 6. There the partial volumes V3 and V4 are surrounded by the partial housings 9'" and 9'". However, these two partial housings also could be formed in one piece which results in one partial housing instead of the two. The so formed one partial housing 9'", 9'", which could be treated as a first partial housing, extends from two mirrors like the mirrors M2 (being the first mirror) and M3 (being the second mirror).

In general the first partial housing additionally extends from at least one reflective surface of at least one additional second optical element from the plurality of optical elements into a second direction of the beam which incidents and/or is reflected on the reflective surface of the second optical element. In such a case also the shape of the first partial housing is adapted to the shape of the beam and to the shape of the second optical element such that the first partial housing also surrounds the beam in the respective second direction or directions related to the second optical element. Further, the first partial housing also surrounds the at least one reflective surface of the second optical element with a gap between the first partial housing and the body of the second optical element.

As seen from FIGS. 7a, 7b and 7c the partial housings 9. 9' are not necessarily of prismatic or cylindrical shape. In general the shape of the partial housings follow the shape of the beam 10 which transforms for example from an about rectangular shaped cross-section in the object field OF to an about circular and/or elliptical shaped cross-section. After this the cross-section transforms back again to an about rectangular shaped cross-section in the image field IF. During this transformation the sizes of the cross-sections vary along the propagation way of the beam 10.

Figure 8:
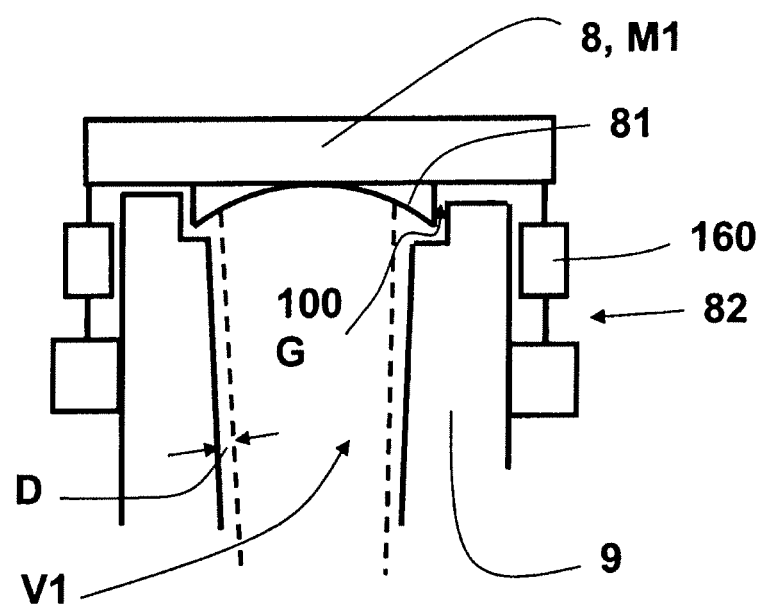

FIG. 8 schematically shows a more detailed view of an embodiment of the present disclosure. A partial housing 9 surrounds a first optical element 8, M1 like a mirror M1. The mirror M1 includes at least one reflective surface 81 which is surrounded by the partial housing 9 such that a gap G, 100 (see also FIG. 4) is formed between the partial housing 9 and the body of the mirror M1. Preferably, as an alternative or in addition, the gap G, 100 is formed between the partial housing 9 and the reflective surface 81. Further, in accordance to the embodiments of the present disclosure the first partial housing 9 is constructed in such a way that it is able to fully support at least the first optical element 8, M1 by a first mounting 82. This means that the first partial housing forms a support structure or a force frame for the optical element 8, M1. The expression that the partial housing 9 is able to fully support the optical element 8, M1 means that the optical element 8, M1 is only held by the partial housing 9 which is able to fully compensate all forces and moments which are generated by the optical element 8, M1, by respective counteracting forces or moments, independent of how the optical element is positioned and/or oriented in space. That means e.g. independent of whether the optical element 8, M1 is suspended and/or supported e.g. by a strut. For this reason advantageously no further support structure or holding structure is desirable to hold the optical element.

However, the feature that the partial housing is able to fully support the optical element involves some demands on the partial housing.

For example one demand is that the lowest eigenfrequency of mechanical vibrations of the partial housing 9 is higher than a certain value. Preferably the lowest eigenfrequency is in a frequency band selected from the group consisting of (50 to 100) Hz, (100 to 150) Hz, (100 to 200) Hz, (100 to 300) Hz, (200 to 400) Hz or (200 to 500) Hz. This means that the partial housing desirably has a certain stiffness to have the desired eigenfrequency. The eigenfrequency depends on the bandwidth of an optional actuator 160 which is arranged at the partial housing 9, 90 for an actuation of the first optical element 8, M1 in at least one degree of freedom and/or for a deformation of the first optical element 8, M1.

Further, in that case that the partial housing 9, 90 fully supports two or more optical elements M1, M2, M3, M4, and at least one of these optically elements can be actuated by at least one actuator in at least one degree of freedom and/or can be deformed, a sufficiently high lowest eigenfrequency of the partial housing 9, 90 avoids a vibration coupling of the two or more optical elements M1, M2, M3, M4.

In one embodiment of the present disclosure the first mounting 82 is constructed as a contactless mounting based on a magnetic field or on magnetic fields. This means that the first optical element 8, M1 is fully supported by this mounting at the partial housing 9, 90 without any direct mechanical contact. Examples for such a mounting are e.g. if the mounting 82 and/or the partial housing 9, 90 include at least one actuator 160. In such cases the actuator 160 is selected from the group consisting of magnetic driving units, linear motors, Lorentz actuators or actuators based on electrostatic effects. Alternative or in addition the first mounting 82 also mechanically contacts the first optical element 8, M1. Examples for such a mounting 82 are e.g. if the mounting 82 and/or the partial housing 9, 90 include at least one actuator 160. In such cases the actuator 160 is based on piezoelectric and/or magnetostrictive effects.

To reduce the contamination of the reflective surfaces of the optical elements M1, M2, M3, M4, in one embodiment of the present disclosure, the actuator 160 is preferably arranged on an outside surface of the partial housing 9, 90 which does not enclose the beam 10 of the first partial housing 9, 90 as it is schematically shown in FIG. 7a and FIG. 8.

To additionally reduce the contamination of the reflected surfaces the optical elements M1, M2, M3, M4 in a further embodiment of the disclosure at least 25% of the surface of the body of the optical element, like the first optical element 8, M1, is arranged outside a volume defined by the first partial housing 9, 9', 90, the at least one reflective surface of the first optical element 8, M1 and the gap 100, G between the first partial housing 9, 9', 90 and the body of the first optical element 8, M1. This can be seen from FIG. 8 in which the non-reflective parts of the body of the mirror 8, M1 are arranged outside of the partial volume V1 which results from the partial housing 9, the reflective surface 81 of the optical element 8, M1 and the gap 100, G between the partial housing 9 and the body of the element 8, M1.

What is claimed is:

1. A system, comprising:
an optical arrangement, comprising:
a plurality of optical elements including a first optical element, each of the plurality of optical elements comprising a body and a reflective surface supported by the body, the plurality of optical elements configured to transmit a beam along a beam path; and
a first partial housing extending from the reflective surface of the first optical element into a direction of a first portion of the beam which is incident on and/or reflected from the reflective surface of the first optical element; and
a measurement structure which does not support the plurality of optical elements, the measurement structure comprising a sensor configured to determine a position and/or an orientation of the first optical element relative to the measurement structure,
wherein:
the first partial housing surrounds the first portion of the beam;
the first partial housing surrounds the reflective surface of the first optical element such that there is a gap between the first partial housing and the body of the first optical element;
the first partial housing is constructed to fully support the first optical element by a first mounting;
the measurement structure at least partly surrounds the first partial housing;
the first optical element has a reference surface;
a distance between the reference surface of the first optical element and the sensor is at most 50 millimeters; and
the system is an EUV projection exposure system.

2. The system of claim 1, wherein the measurement structure is thermally decoupled from the first partial housing.

3. The system of claim 1, wherein the first partial housing has an opening defining an inlet of the beam and/or outlet of the beam.

4. The system of claim 1, wherein:
the plurality of optical elements includes a second optical element;
the first partial housing extends from the reflective surface of the second optical element into a direction of a second portion of the beam which is incident on and/or reflected from the reflective surface of the second optical element;
the first partial housing surrounds the second portion of the beam; and
the first partial housing surrounds the reflective surface of the second optical element such that there is a gap between the first partial housing and the body of the second optical element.

5. The system of claim 1, wherein the first mounting is a contactless mounting configured to operate based on one or more magnetic fields.

6. The system of claim 1, wherein the first mounting mechanically contacts the first optical element.

7. The system of claim 1, wherein the first partial housing comprises an actuator configured to actuate the first optical element in at least one degree of freedom.

8. The system of claim 7, wherein the actuator comprises a member selected from the group consisting of a magnetic driving unit, a linear motor, a Lorentz actuator, an actuator based on piezoelectric effects, an actuator based on magnetostrictive effects, and actuator based on electrostatic effects.

9. The system of claim 7, wherein the actuator is on an outside surface of a portion of the first partial housing which does not enclose the beam of the first partial housing.

10. The system of claim 1, wherein at least 25% of a surface of the body of the first optical element is outside a volume defined by the first partial housing, the reflective surface of the first optical element and the gap between the first partial housing and the body of the first optical element.

11. The system of claim 1, wherein the first partial housing has a lowest eigenfrequency of mechanical vibrations in a frequency band selected from the group consisting of 50 to 100 Hz, 100 to 150 Hz, 100 to 200 Hz, 100 to 300 Hz, 200 to 400 Hz, and 200 to 500 Hz.

12. The system of claim 1, wherein the measurement structure has a lowest eigenfrequency of mechanical vibration in a frequency band selected from the group consisting of higher than 150 Hz, higher than 300 Hz, higher than 600 Hz, higher than 1000 Hz, and higher than 1500 Hz.

13. The system of claim 1, wherein:
the plurality of optical elements comprises a second optical element;
the system further comprises a second partial housing;
the second partial housing surrounds a second portion of the beam;
the second partial housing surrounds the reflective surface of the second optical element such that there is a gap between the second partial housing and the body of the second optical element;
the second partial housing is constructed to fully support the second optical element by a second mounting.

14. The system of claim 13, wherein the first and second mounting are the same type of mounting.

15. The system of claim 1, wherein the system comprises a projection objective, and the projection objective comprises the optical arrangement.

16. The system of claim 15, further comprising an illumination system.

17. The system of claim 16, further comprising an EUV light source.

18. The system of claim 15, wherein the projection objective further comprises a housing that surrounds the first partial housing and the measurement structure.

19. The system of claim 16, wherein the projection objective further comprises a housing that surrounds the first partial housing and the measurement structure, wherein the housing is between the optical arrangement and the illumination system.

20. The system of claim 1, wherein the first partial housing comprises an actuator configured to deform the first optical element.

21. The system of claim 20, wherein the actuator comprises a member selected from the group consisting of a magnetic driving unit, a linear motor, a Lorentz actuator, an actuator based on piezoelectric effects, an actuator based on magnetostrictive effects, and actuator based on electrostatic effects.

22. The system of claim 20, wherein the actuator is on an outside surface of a portion of the first partial housing which does not enclose the beam of the first partial housing.

23. The system of claim 1, further comprising a second housing surrounding the first partial housing and the measurement structure.

24. The system of claim 1, further comprising a thermal shield in the first partial housing.

25. The system of claim 1, further comprising a thermal shield between the first partial housing and the measurement structure.

26. The system of claim 1, wherein the gap is a shortest distance between the first partial housing and the body of the first optical element, and the gap has a width in the range of 0.5 millimeter to 5 millimeters.

27. The system of claim 1, wherein the gap is a shortest distance between the first partial housing and the body of the first optical element, and the gap has a width in the range of one millimeter to 10 millimeters.

28. The system of claim 1, wherein:
the system is configured to project an object in an object field into an image field;
the beam has a partial volume defined by integrating all cross-sections of the beam along the beam path between the object and the first optical element; and
a smallest distance between an inner surface of the first partial housing and an outer surface of the partial volume is between three millimeters and five millimeters.

29. The system of claim 1, wherein:
the system is configured to project an object in an object field into an image field;
the beam has a partial volume defined by integrating all cross-sections of the beam along the beam path between the object and the first optical element; and
a volume of the first partial housing is 1% to 30% larger than the partial volume.

30. The system of claim 1, wherein the measurement structure does not support the first partial housing.

31. The system of claim 1, wherein the distance between the reference surface of the first optical element and the sensor is at most 20 millimeters.

32. A method of using a projection objective, the method comprising:
illuminating an object in an object field; and
using the projection objective to project an image of the object into an image field,
wherein the projection objective comprises an optical arrangement which comprises:
a plurality of optical elements including a first optical element, each of the plurality of optical elements comprising a body and a reflective surface supported by the body, the plurality of optical elements configured to transmit a beam along a beam path; and
a first partial housing extending from the reflective surface of the first optical element into a direction of a first portion of the beam which is incident on and/or reflected from the reflective surface of the first optical element; and
a measurement structure which does not support the plurality of optical elements, the measurement structure comprising a sensor configured to determine a position and/or an orientation of the first optical element relative to the measurement structure, and
wherein:
the first partial housing surrounds the first portion of the beam;
the first partial housing surrounds the reflective surface of the first optical element such that there is a gap between the first partial housing and the body of the first optical element;
the first partial housing is constructed to fully support the first optical element by a first mounting;
the first optical element has a reference surface;
a distance between the reference surface of the first optical element and the sensor is at most 50 millimeters; and
the measurement structure at least partly surrounds the first partial housing.

33. The method of claim 32, wherein the measurement structure does not support the first partial housing.

34. The method of claim 32, wherein the distance between the reference surface of the first optical element and the sensor is at most 20 millimeters.

35. A method of using a projection exposure system which comprises an illumination system and a projection objective, the method comprising:
using the illumination system to illuminate an object in an object field; and
using the projection objective to project an image of the object into an image field,
wherein the projection objective comprises an optical arrangement which comprises:
a plurality of optical elements including a first optical element, each of the plurality of optical elements comprising a body and a reflective surface supported by the body, the plurality of optical elements configured to transmit a beam along a beam path; and
a first partial housing extending from the reflective surface of the first optical element into a direction of a first portion of the beam which is incident on and/or reflected from the reflective surface of the first optical element; and
a measurement structure which does not support the plurality of optical elements, the measurement structure comprising a sensor configured to determine a position and/or an orientation of the first optical element relative to the measurement structure, and
wherein:
the first partial housing surrounds the first portion of the beam;
the first partial housing surrounds the reflective surface of the first optical element such that there is a gap between the first partial housing and the body of the first optical element;
the first partial housing is constructed to fully support the first optical element by a first mounting;
the first optical element has a reference surface;
a distance between the reference surface of the first optical element and the sensor is at most 50 millimeters; and
the measurement structure at least partly surrounds the first partial housing.

36. The method of claim 35, wherein the measurement structure does not support the first partial housing.

37. The method of claim 35, wherein the distance between the reference surface of the first optical element and the sensor is at most 20 millimeters.

38. A system, comprising:
an optical arrangement, comprising:
a plurality of optical elements including a first optical element, each of the plurality of optical elements having a body including a reflective surface, the plurality of optical elements configured to transmit a beam along a beam path; and
a first partial housing extending from the reflective surface of the first optical element into a direction of a first portion of the beam which is incident on and/or reflected from the reflective surface of the first optical element; and
a measurement structure which does not mechanically support the plurality of optical elements,
wherein:
the first partial housing surrounds the first portion of the beam;
the first partial housing surrounds the reflective surface of the first optical element such that there is a gap between the first partial housing and the body of the first optical element;
the first partial housing is constructed to fully support the first optical element by a first mounting;
the measurement structure at least partly surrounds the first partial housing;
at least 25% of a surface of the body of the first optical element is outside a volume defined by the first partial housing, the reflective surface of the first optical element and the gap between the first partial housing and the body of the first optical element;
the first optical element has a reference surface;
the measurement structure comprises a sensor configured to determine a position and/or an orientation of the first optical element relative to the measurement structure;
a distance between the reference surface of the first optical element and the sensor is at most 50 millimeters; and
the system is an EUV projection exposure system.

39. The system of claim 38, wherein the measurement structure does not support the first partial housing.

40. The system of claim 38, wherein the distance between the reference surface of the first optical element and the sensor is at most 20 millimeters.

* * * * *